United States Patent [19]

Septfons

[11] Patent Number: 4,924,352
[45] Date of Patent: May 8, 1990

[54] METHOD AND DEVICE FOR COOLING AN INTEGRATED CIRCUIT PACKAGE

[75] Inventor: René Septfons, Paris, France

[73] Assignee: Societe Anonyme dite: Alcatel CIT, Paris, France

[21] Appl. No.: 287,251

[22] Filed: Dec. 21, 1988

[30] Foreign Application Priority Data

Dec. 22, 1987 [FR] France .................. 87 17920

[51] Int. Cl.⁵ .............................................. H05K 7/20
[52] U.S. Cl. ..................................... 361/388; 29/840; 165/80.3; 165/185; 357/81
[58] Field of Search .................. 29/840; 174/16.3; 357/81; 165/80.2, 80.3, 80.4, 185; 361/383, 386, 387, 388, 400, 410

[56] References Cited

U.S. PATENT DOCUMENTS 4,420,767 12/1983 Hodge et al. ...................... 357/81
4,628,407 12/1986 August ............................... 361/386
4,682,269 7/1987 Pitasi ................................. 361/388

FOREIGN PATENT DOCUMENTS 0129966 4/1984 European Pat. Off. .
0139431 5/1985 European Pat. Off. .
1414466 9/1969 Fed. Rep. of Germany .
1084028 9/1967 United Kingdom .

OTHER PUBLICATIONS

Integrated Circuit Package & Heat Sink, Tiffany, IBM Tech. Discl. Bull., vol. 13, No. 1, Jun. 1970, p. unknown.

Primary Examiner—Gerald P. Tolin
Attorney, Agent, or Firm—Sughrue, Mion, Zinn, Macpeak & Seas

[57] ABSTRACT

The invention relates to cooling integrated circuit packages (14) for surface mounting in a hybrid circuit. The invention provides a cooling method which consists in soldering the bottom of the integrated circuit package (14) to one side of the hybrid circuit substrate (10) and in soldering a heat-dissipating peg (30) to its other side. In order to do this, the bottom of the package is provided with a tinnable area and the substrate (10) is provided with two overlying tinnable areas on opposite faces thereof, said areas being put into communication with each other by at least one plated-through hole (31). The peg (30) is pierced by a channel terminating in a capillary which opens out adjacent to the substrate and which leads to at least one solder receptacle (64, 67) opening out into a side wall of the peg, said channel serving to absorb any excess solder from beneath the bottom of the integrated circuit package (14) which might otherwise give rise to short circuiting solder bridges between connection pads or else prevent the integrated circuit package (14) from being pressed adequately against the substrate (10).

10 Claims, 3 Drawing Sheets

METHOD AND DEVICE FOR COOLING AN INTEGRATED CIRCUIT PACKAGE

The present invention relates to cooling integrated circuit packages, in particular packages intended for surface mounting in hybrid circuits, where hybrid circuits are assemblies of electronic components at high component density on a flat support called a "substrate" which is generally constituted by a thin ceramic plate covered on one or two faces with a printed network of resistors and conducting tracks which are optionally protected by a vitrified insulating layer, with the tracks terminating in pads capable of being tinned and serving for connecting to the hybrid circuit components and pins for connection to the external environment.

BACKGROUND OF THE INVENTION

Integrated circuit packages provided for this type of utilization are generally in the form of a ceramic cup closed by a metal lid and provided with external connection pads around its outside for surface mounting purposes, said pads being connected via feedthroughs passing through the wall of the cup to internal connection pads which are connected to an integrated circuit chip which is fixed to a metallized area provided inside the cup, at the bottom thereof, with fixing being brazing or soldering.

One known way of cooling this type of integrated circuit package is to glue or snap-fasten a heat-dissipating metal part on the outside of the bottom of the ceramic cup which is in direct thermal contact with the integrated circuit, and to mount the package upside-down on the substrate of the hybrid circuit. This solution suffers from the drawback of causing the mass of the radiator to be supported by the integrated circuit package, thereby making it more fragile and also making the soldering between its external connection pads and the track on the substrate more fragile. Another drawback lies in not using the substrate as a heat-dissipator while simultaneously considerably increasing the height of the hybrid circuit which, generally, is intended to be mounted proud on a printed circuit.

The object of the present invention is to avoid these drawbacks.

SUMMARY OF THE INVENTION

The present invention provides a method of cooling an integrated circuit package for mounting on a substrate, the method consisting in:

providing the outside surface of the bottom of the integrated circuit package with a tinnble area suitable for fixing by soldering;

providing the substrate in the zone where the integrated circuit package is to be positioned, with two tinnable areas overlying each other on opposite faces of the substrate, with the first tinnable area being placed facing the tinnable area on the bottom of the integrated circuit package and with the second tinnable area communicating with the first via at least one plated-through hole going through the substrate; and soldering the bottom of the integrated circuit package on top of the substrate by means of the tinnable areas being brought fact to face, and soldering a peg underneath the substrate level with the integrated circuit package, the peg having a tinnable surface enabling it to be soldered to the second tinnable area of the substrate, and being pierced by at least one metal-walled channel terminating at one end in a capillary which opens out into the tinnable surface and terminating at its other end in a solder receptacle, said channel serving to absorb any excess solder between the substrate and the bottom of the integrated circuit package via the, or each, plated-through hole.

If the substrate suffices for dissipating the heat generated by the integrated circuit package, the peg is configured to have only a small contact area with the substrate so as to make it easily separated therefrom after soldering and absorbing any excess solder between the bottom of the integrated circuit package and the substrate, merely by breaking the solder fixing it to the substrate.

The invention also provides cooling device for implementing the above method.

If the peg is not removed, then the fact that the substrate is interposed between the integrated circuit package and the heat-dissipating metal peg, prevents any mechanical force from being transmitted from the peg to the integrated circuit package or to the soldered connections at its external connection pads. In addition, regardless of whether the integrated circuit package is cooled by the substrate on its own or else by means of a metal peg soldered beneath the substrate, it is possible to reduce the overall bulk of the hybrid circuit once mounted proud on a printed circuit since any peg is then received in a hole provided in the printed circuit insides an empty space which is provided for the printed circuit in any event.

By soldering the integrated circuit package to the substrate, thermal contact between the package and the substrate is greatly improved compared with gluing or assembling by snap-fastening means, however such assembly suffers from a problem of excess solder, given that it is difficult to control the amount of solder that is deposited during a tinning operation, and this may result either in the integrated circuit package being at the wrong height relative to the substrate, thereby preventing its external connection pads from being soldered to the pads on the substrate tracks, or else to short-circuit bridges between the various pads. This problem is solved by soldering the peg to the other side of the substrate simultaneously while soldering the package, thereby sucking up excess solder through one or more plated-through holes provided in the substrate by virtue of surface tension phenomena acting on the solder in the capillary portions of its channels while maintaining excellent thermal contact with the integrated circuit package via the solder.

BRIEF DESCRIPTION OF THE DRAWINGS

An embodiment of the invention is described by way of example with reference to the accompanying drawings, in which.

MORE DETAILED DESCRIPTION

Figure 1:
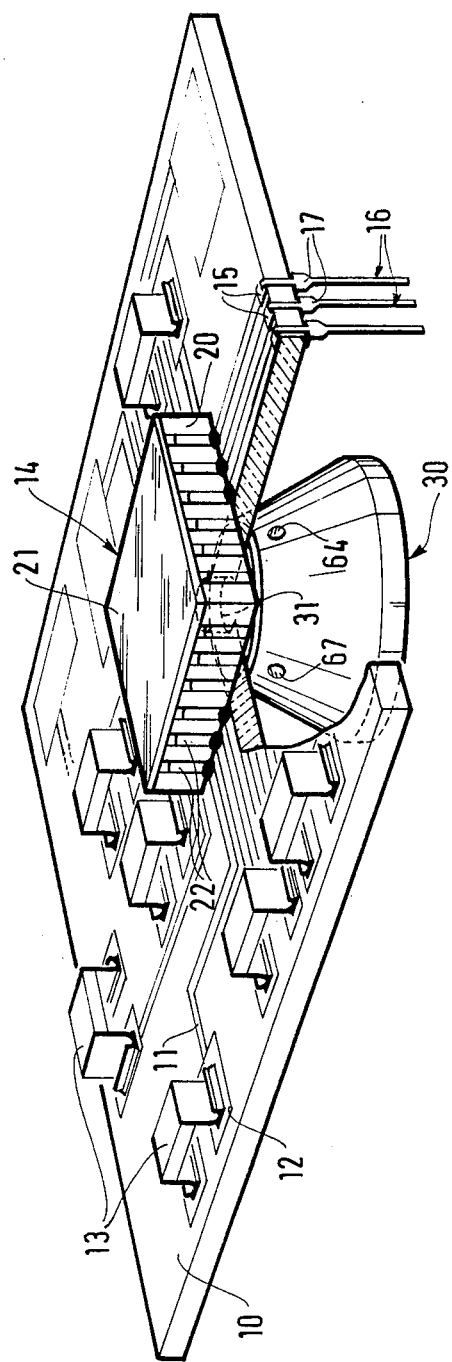
FIG. 1 is a partially cut-away diagrammatic perspective view of a hybrid circuit fitted with an integrated circuit package mounted using a cooling device in accordance with the invention.

FIG. 1 shows a hybrid circuit comprising a substrate 10 supporting a printed network of resistors and conducting tracks 11 leading to tinnable connection pads 12 for surface mounting electronic components 13 including an integrated circuit package 14, and also for connection to terminal pads 15 which have electrical connection pins 16 soldered thereto for providing external connections to the hybrid circuit.

The substrate 10 is a thin ceramic plate covered on one or both of its faces with a network of resistors and conducting tracks 11 by silk-screen printing, with the network(s) optionally being protected by a vitrified insulating layer (not shown) apart from its connection pads 12, 15 which are left accessible for tinning.

Figure 2:
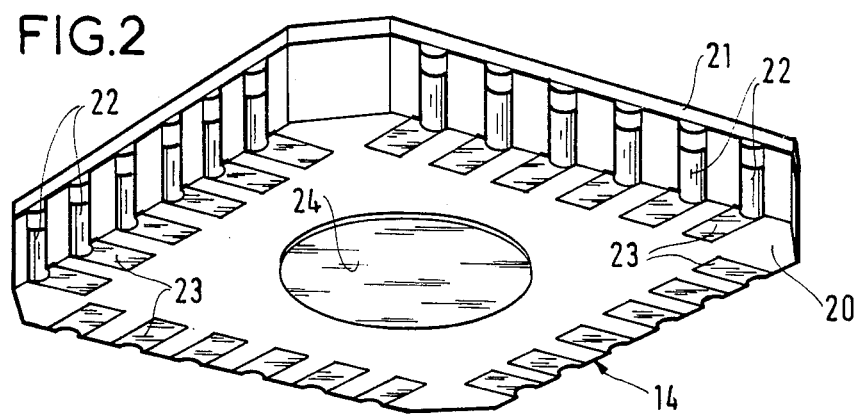
FIG. 2 is a perspective view seen from below of the integrated circuit package shown in FIG. 1.

The integrated circuit package 14 for surface mounting is in the form of a rectangular ceramic cup 20 which is closed by a metal lid 21 and which is provided around its periphery with external connection pads 22 which extend beneath the package in the form of rectangular contact areas 23 which can be seen in FIG. 2.

The pins 16 have respective heads 17 fitted with claws enabling them to be mounted on the edge of the substrate at its edge terminal pads 15. The pins extend perpendicularly to the substrate 10 and enable the hybrid circuit to be subsequently mounted on a printed circuit of larger area, with the hybrid circuit standing a little above the printed circuit.

The hybrid circuit components are assembled using a conventional "reflow" technique which consists in tinning the substrate 10 while it is bare, thereby forming blobs of solder on its connections pads 12 and 15, in placing the components and the pins on the substrate 10 with their own connection pads coming into contact with the blobs of solder on the pads of the substrate 10, in holding them in place by means of glue or by means of a temporary support, and then in soldering all of the components and pins simultaneously by heating the assembly until the blobs of solder on the substrate melt and the solder migrates by capillarity onto the pads of the components and onto the claws of the pins.

In addition to conventional electronic components, a frustoconical metal peg 30 constituting a heat-dissipator is disposed beneath the bottom face of the substrate 10 level with the location for the integrated circuit package 14. During the reflow operation, this metal peg is soldered to the substrate 10 simultaneously with the bottom of the integrated circuit package 14 and the other components being soldered thereto, with the peg and the package being soldered via three tinnable areas (not visible in FIG. 1), one of which is placed on the integrated circuit package 14 in the center of the outside surface of its bottom and the other two of which coincide on opposite faces of the substrate 10.

FIG. 2 shows the outside of the bottom of the rectangular cup 20 constituting the integrated circuit package 14 and having rectangular contact areas 23 around its periphery which extend external connection pads 22 received in the side walls of the cup 20 and intended to be soldered to connection pads 12 on the substrate, with the middle of the cup including a tinnable area 24 which is shown as being circular in this case and which is electrically insulated from the rectangular contact areas 23, and which is intended to enable the bottom of the cup 20 to be soldered to the substrate 10.

Figure 3:
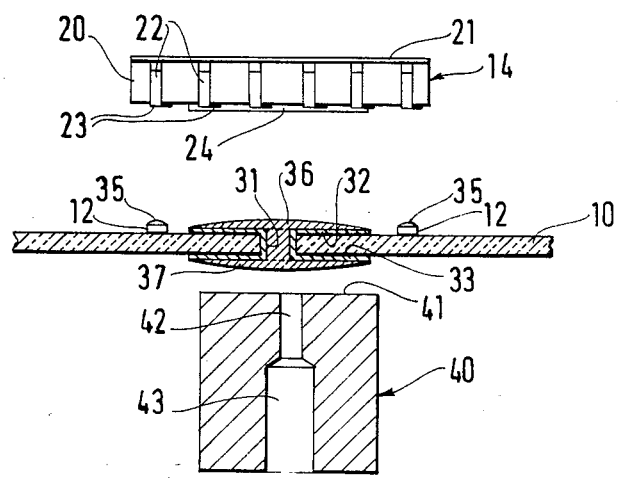
FIG. 3 is a partial exploded and fragmentary sectional view showing the integrated circuit package and a cooling device in accordance with the invention prior to their being soldered to the substrate.

FIG. 3 is an exploded view including a section through the substrate 10 at a plated-through hole 31 situated approximately in the center of the location for receiving the integrated circuit package 14, with the figure also showing a side view of the integrated circuit package 14 above the substrate and a heat-dissipating metal peg 40 seen in section beneath the substrate.

The substrate 10 is shown in its tinned state. On its face adjacent to the integrated circuit package 14 it has connection pads 12 facing the intersections between the rectangular contact areas 23 and the external connection pads 22 of the integrated circuit package 14, and in the center of the connection pads 12 which outline the periphery of a rectangle, there is a tinnable area 32 of comparable shape and size to the tinnable area 24 at the bottom of the facing package 14. The opposite face of the substrate 10 facing away from the integrated circuit package 14 has another tinnable area 33 which communicates with the first area 32 via a platedthrough hole 31 and optionally via other plated-through holes, depending on the sizes of the areas 32 and 33. By virtue of the tinning, the plated-through hole 31 is filled with solder and each of the connection pads 12 and the tinnable areas 32 and 33 is covered with a blob of solder 35, 36, or 37.

The heat-dissipating peg 40 is cylindrical in shape and is soldered at one of its bases 41 to the tinnable area 33 (circular in this case) on the substrate 10. The peg is pierced by an axial channel terminating at said base 41 by a capillary tube 42 which opens out into the vicinity of the plated-through hole 31 in the substrate 10, and which opens out adjacent to the opposite base into a solder receptacle 43 of greater diameter than the capillary.

Figure 4:
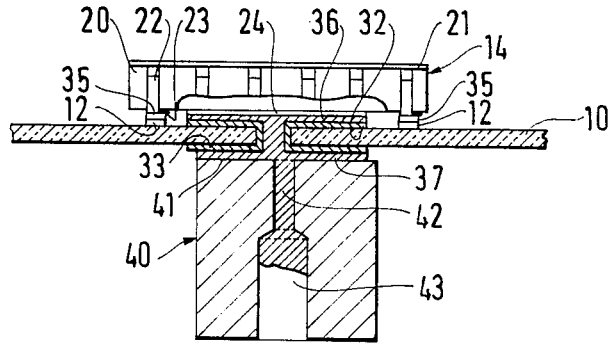
FIG. 4 is a fragmentary section showing the integrated circuit package and its cooling device after they have been soldered to the substrate.

During the reflow operation, when the integrated circuit package 14 and the heat-dissipating peg 40 are pressed against the substrate from opposite sides onto the blobs 36 and 37 covering the tinnable areas 32 and 33, with the heat-dissipating peg having been previously treated with an appropriate cleaning flux, the excess solder contained in the blobs 36 and 37 is sucked up due to surface tension phenomena by the capillary portion 42 of the channel through the peg and therefore takes up position in the receptacle portion 43 as shown in FIG. 4. By virtue of this, the integrated circuit package 14 is pressed intimately against the surface of the substrate and all of the rectangular contact areas 23 of its external connection pads are brought into contact with the blobs of solder 35 on the connection pads on the substrate 10, ensuring that the connection pads are properly soldered in all cases without there being any danger of solder bridges being established between the pads and the tinnable areas 24 or 32.

Figure 5:
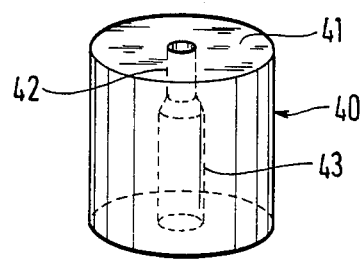
FIG. 5 is a perspective view of the cooling device shown in section in FIGS. 3 and 4.

FIG. 5 is a perspective view of a cylindrical heat-dissipating peg 40. The peg may be small in diameter with small-area bases so that its solder connection to the substrate 10 is fragile and easily broken in the event that substrate 10 suffices on its own for dissipating the heat generated by the integrated circuit package 14.

Figure 7:
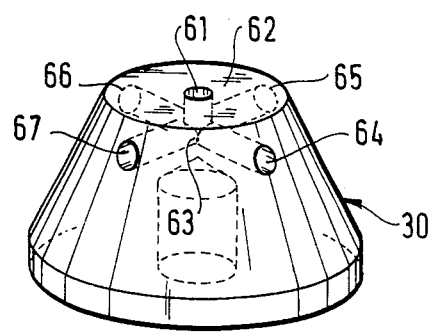
FIGS. 7 and 8 are perspective views of two other variants of the cooling device, which are frustoconical.
Figure 8:
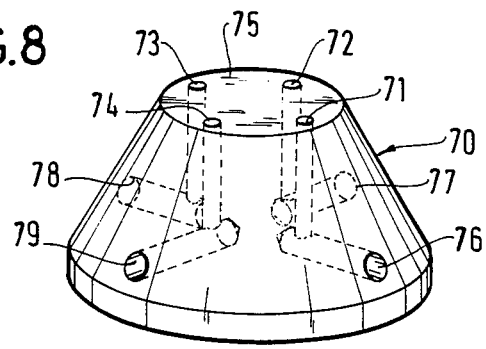

FIGS. 5, 7, and 8 show other types of cylindrical or frustoconical heat-dissipating pegs which are pierced by one or more angled channels in order to avoid occupying the face of the peg furthest from the substrate 10 thus leaving it free to be worked, for example to provide means for fixing to a heat-dissipating plate for increasing the radiating area.

Figure 6:
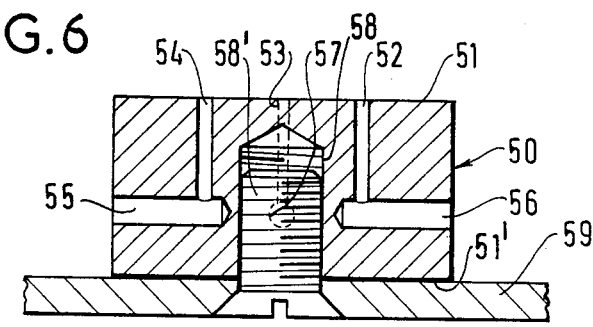
FIG. 6 is a section view through a variant of the cooling device shown in FIGS. 3, 4, and 5.

FIG. 6 is a section through a cylindrical heat-dissipating peg 50 for soldering to a substrate 10 via a base 51. The peg 50 has four angled channels (three of which are visible) each having a capillary portion 52, 53, or 54 opening out into the base 51 at the corners of a square, and each having a solder receptacle 55, 56, and 57 opening out into the side face. The base 51' of the peg furthest from the substrate is pierced by a tapped blind hole 58 for receiving a screw 58' which is used for fixing a heat-dissipating plate 59.

FIGS. 7 and 8 are sections through frustoconical heat-dissipating pegs analogous to that visible in FIG. 1 and intended to have their small bases soldered to the substrate 10. The peg 30 in FIG. 7 is the same as that fitted to the hybrid circuit shown in FIG. 1. It has a branching channel passing therethrough comprising an auxiliary capillary 61 opening out at its external end through the small base 62 for soldering to the substrate 10 and opening out at its internal end into a chamber 63 placed at the intersection between a plurality of branches 64, 65, 66, and 67 arriving at right angles into the chamber and opening out into the side wall of the peg, with said branches constituting a solder receptacle. The FIG. 8 peg 70 is pierced like the peg of FIG. 6 by four angled channels each having its own capillary 71, 72, 73, or 74 parallel to the axis of the truncated cone and opening out into the small base 75 at a respective one of the four corners of the square, with each channel having a respective solder receptacle 76, 77, 78, or 79 extending perpendicularly to the axis of the truncated cone and opening out through its side wall.

Without going beyond the scope of the invention, it is possible to modify various dispositions and to replace various means by equivalent means. In particular, the shape of the heat-dissipating peg can be modified as a function of requirements and its outside surface may be provided with fins or grooves as is conventional for semiconductor radiators. It is also possible to provide the face of the peg which is furthest from the substrate with fixing means other than a tapped hole, e.g. it may be provided with a riveting stud or with a threaded shank, thereby avoiding the drawback of removing substance from the peg which has the side effect of reducing its thermal conductivity and inertia.

I claim:

1. A method of cooling an integrated circuit package for mounting on a substrate, the method consisting in:
    providing the outside surface of the bottom of the integrated circuit package with a tinnable area suitable for fixing by soldering;
    providing the substrate in the zone where the integrated circuit package is to be positioned, with two tinnable areas overlying each other on opposite faces of the substrate, with the first tinnable area being placed facing the tinnable area on the bottom of the integrated circuit package and with the second tinnable are communicating with the first via at least one plated-through hole going through the substrate; and
    soldering the bottom of the integrated circuit package on top of the substrate by means of the tinnable areas being brought face to face, and soldering a peg underneath the substrate level with the integrated circuit package, the peg having a tinnable surface enabling it to be soldered to the second tinnable area of the substrate, and being pierced by at least one metal-walled channel terminating at one end in a capillary which opens out into the tinnable surface and terminating at its other end by a solder receptacle, said channel serving to absorb any excess solder between the substrate and the bottom of the integrated circuit package via the, or each, plated-through hole.

2. A method according to claim 1, wherein the peg comes into contact with the substrate via a small area so that its connection to the substrate by soldering is fragile, and in that it is separated from the substrate after being soldered thereto, merely by breaking.

3. A device for cooling an integrated circuit package mounted on a substrate, said device comprising a heat-dissipating peg soldered together with the bottom of the integrated circuit package respectively, at a common location on opposite faces of said substrate, said substrate including tinnable areas disposed on each of said opposite faces, and said tinnable areas on the substrate being in communication with each other via reflow solder extending through at least one plated-through hole and said heat-dissipating peg being pierced by at least one metal-walled channel terminating at one end in a capillary opening out adjacent to the substrate and terminating at another end in at least one solder receptacle bearing excess reflow solder such that in soldering the heat-dissipating peg and the integrated circuit package to said substrate by reflow solder, excess reflow solder is sucked up by the capillary into said at least one solder receptacle resulting in the integrated circuit package being intimately pressed against the surface of the substrate to thereby facilitate proper soldering of connecting pads of the integrated circuit package to corresponding connecting pads of the substrate.

4. A device according to claim 3, wherein said heat-dissipating peg capillary opens out into the face of said peg facing the substrate, and said at least one solder receptacle opens out into a side face of said peg in order to avoid occupying the face of the peg which faces away from the substrate with said at least one receptacle.

5. A device according to claim 3, wherein said heat-dissipating peg is pierced by a branching channel including said capillary which opens out to the outside of the peg in said face which faces the substrate, and opens out inside the peg into a chamber placed at the intersection between a plurality of branches constituting solder receptacles and which open out into the side face of the peg.

6. A device according to claim 4, wherein said heat-dissipating peg is pierced by a plurality of angled channels having capillaries opening out at outside ends thereof at the corners of a square in the face of the peg facing the substrate, and each capillary having a solder receptacle opening out to a side face of the peg.

7. A device according to claim 3, wherein said heat-dissipating peg includes fixing means in its face facing away from the substrate, and a heat-dissipating plate fixed by said fixing means to said peg.

8. A device according to claim 3, wherein said heat-dissipating peg is cylindrical.

9. A device according to claim 3, wherein said heat-dissipating peg is frustoconical.

10. A device according to claim 3, wherein said peg is in contact with said substrate over a small area, whereby said peg is readily separable from said substrate after being soldered thereto, merely by breaking said peg from said substrate.

* * * * *